(12) United States Patent
Golshan

(10) Patent No.: US 6,219,812 B1
(45) Date of Patent: Apr. 17, 2001

(54) APPARATUS AND METHOD FOR INTERFACING BOUNDARY-SCAN CIRCUITRY WITH DTL OUTPUT DRIVERS

(75) Inventor: Farideh Golshan, Mountain View, CA (US)

(73) Assignee: Sun Microsystems, Inc., Palo Alto, CA (US)

(*) Notice: Subject to any disclaimer, the term of this patent is extended or adjusted under 35 U.S.C. 154(b) by 0 days.

(21) Appl. No.: 09/095,795

(22) Filed: Jun. 11, 1998

(51) Int. Cl.$^7$ .................................................. G01R 31/28
(52) U.S. Cl. ......................... 714/727; 714/726; 714/724; 326/86
(58) Field of Search .................................. 714/727, 724, 714/726, 729, 731, 709; 326/86, 87, 82, 62

(56) References Cited

U.S. PATENT DOCUMENTS

| | | | |
|---|---|---|---|
| 4,985,903 | * 1/1991 | Heichler | 375/36 |
| 5,036,215 | * 7/1991 | Masleid et al. | 307/243 |
| 5,457,381 | * 10/1995 | Farwell | 324/158.1 |
| 5,513,186 | * 4/1996 | Levitt | 371/22.3 |
| 5,534,798 | * 7/1996 | Phillips et al. | 326/108 |
| 5,589,787 | * 12/1996 | Odinot | 327/202 |
| 5,617,430 | * 4/1997 | Angelotti et al. | 371/27 |
| 5,627,839 | * 5/1997 | Whetsel | 371/22.3 |

(List continued on next page.)

FOREIGN PATENT DOCUMENTS

| | | | |
|---|---|---|---|
| 0 805 577 | * 11/1997 | (EP) | H04L/12/40 |
| 0 848 333 | * 6/1998 | (EP) | G06F/13/40 |
| 10-83234 | * 3/1998 | (JP) | G06F/3/00 |
| 10-294771 | * 11/1998 | (JP) | H04L/29/08 |

OTHER PUBLICATIONS

J. Kudoh et al. "A CMOS gate array with dynamic–termination GTL I/O circuits", 1995 IEEE International Conference on Computer Design: VLSI in Computers and Processors, Proceedings, pp. 25–29 (Oct. 1995).*
R. Ammar et al. "GTL: a low–swing solution for high–speed digital logic", WESCON '95 'Microelectronics Communications Technology Producing Quality Products Mobile and Portable Power Emerging Technologies', Conference record, pp. 79–85 (Nov. 1995).*
R.E. Taylor, "Powering today's high speed bus terminators", Thirteenth Annual Applied Power Electronics Conference and Exposition, APEC '98, Conference Proceedings 1998, volume: 1, pp. 483–489 (Feb. 1998).*

Primary Examiner—Albert Decady
Assistant Examiner—Samuel Lin
(74) Attorney, Agent, or Firm—Pennie & Edmonds LLP

(57) ABSTRACT

A system for coupling a Dynamic Termination Logic (DTL) type output driver to IEEE 1149.1 boundary-scan circuitry includes a logic circuit that converts the data and output enable signals of the IEEE 1149.1 specification to test "q_up," "q_dn" and "q25_dn" signals meeting the requirements of the DTL driver. These test q_up, q_dn and q25_dn are selectively provided to the DTL driver during boundary-scan testing of the output driver. In a further refinement, the system also converts functional q_up, q_dn and q25_dn signals provided by the circuit under test to the data and output enable signals of the IEEE 1149.1 specification. The system allows the widely used IEEE 1149.1 boundary-scan standard to be used with DTL drivers. The resulting compatibility simplifies the testing and use of the DTL drivers, and provides a new boundary-scan standard for use with DTL drivers that is compliant with the IEEE 1149.1 standard.

20 Claims, 7 Drawing Sheets

U.S. PATENT DOCUMENTS

| | | | | |
|---|---|---|---|---|
| 5,767,699 | * | 6/1998 | Bosnyak et al. | 326/86 |
| 5,859,657 | * | 1/1999 | Donahue et al. | 347/237 |
| 5,872,796 | * | 2/1999 | Golshan et al. | 371/22.32 |
| 5,892,778 | * | 4/1999 | Golshan et al. | 371/22.32 |
| 5,942,918 | * | 8/1999 | Ang et al. | 327/57 |
| 5,977,807 | * | 11/1999 | Watanabe | 327/175 |
| 5,990,701 | * | 11/1999 | Starr | 326/30 |
| 6,026,456 | * | 2/2000 | Ilkbahar | 710/101 |
| 6,028,423 | * | 2/2000 | Sanchez | 324/96 |
| 6,058,496 | * | 5/2000 | Gillis et al. | 714/727 |

\* cited by examiner

APPARATUS AND METHOD FOR INTERFACING BOUNDARY-SCAN CIRCUITRY WITH DTL OUTPUT DRIVERS

FIELD OF THE INVENTION

The present invention relates generally to digital circuits, and more particularly to circuits to interface DTL logic outputs to standard boundary-scan registers.

BACKGROUND OF THE INVENTION

The testing of integrated circuits commonly involves an operation of shifting test instructions and associated test data into an integrated circuit and subsequently analyzing the output generated by the integrated circuit. The Joint Test Access Group (JTAG) developed an integrated circuit and circuit board testing standard called the IEEE Standard Test Access Port and Boundary-Scan Architecture IEEE Std 1149.1-1990 and IEEE Std 1149.1a-1993 (referred to herein as the IEEE 1149.1 standard), which is incorporated herein by reference.

The IEEE 1149.1 standard defines test logic that can be included in integrated circuits to provide standardized approaches to testing an integrated circuit, testing the interconnections between integrated circuits once they have been assembled onto a printed circuit board, and observing or modifying circuit activity during the circuit's normal operation.

Many complex circuits use boundary-scan testing techniques to test the output buffers of the circuit. For circuits using conventional two-state or three-state CMOS output buffers, designers commonly use the boundary-scan implementation defined in the IEEE 1149.1 standard. As is well known, a boundary-scan implementation allows for testing of interconnects in a board environment by loading or "scanning in" test patterns into a series of interconnected boundary-scan registers (BSRs). Each test pattern loaded in the BSRs provides a different set of control and data signals to the output drivers. The response of the output drivers to the test patterns can be captured by an adjacent circuit on the board and scanned out. To run a functional test vector, an input test pattern is scanned in through the BSRs. After one or more clock cycles, the response of the circuit can then be captured in the BSRs and either scanned out or monitored at the output pads.

FIG. 1 is a circuit diagram of a portion of a circuit 100 using a conventional boundary-scan implementation for I/O drivers that have three-state drivers (TSDs). The circuit 100 includes a conventional TSD 103 serving as an output driver, having an output lead connected to an I/O pad 104. The circuit 100 includes conventional BSRs 102 and 112, which are interconnected to form part of a "scan chain" for loading test patterns and scanning out capture data. BSR 102 has an input lead coupled to the output of flip-flop 101. Flip-flop 101 provides an output enable, oe, signal to BSR 102. An input of BSR 112 is coupled to the output of flip-flop 111. Flip-flop 111 provides a data signal, d, input to BSR 112.

In operation in the boundary-scan mode, BSRs 102 and 112 are loaded with a value for enabling or disabling TSD 103, as desired. Accordingly, TSD 103 is controlled as desired by the test pattern loaded into the BSRs to test one of the various functions of the I/O driver. The output signal provided by TSD 103 can then be monitored at the I/O pad 104 and compared to an expected result.

Some high performance circuits such as, for example, microprocessors, use other types of drivers for improved performance. One type of driver that can be used is a linearized impedance control type (LIC) driver. A boundary-scan interfacing method for LIC drivers is disclosed in the commonly assigned patent application entitled "Method for Interfacing Boundary-Scan Circuitry With Linearized Impedance Control Type Output Drivers," Ser. No. 08/885,054, which is herein incorporated by reference. A boundary-scan interface apparatus LIC drivers is disclosed in the commonly assigned patent application entitled "Boundary-Scan Circuit for Use With Linearized Impedance Control Type Output Drivers," Ser. No. 08/885,012, which is herein incorporated by reference. Another type of driver that can be used is a Dynamic Termination Logic (DTL) type I/O driver. In DTL signaling systems, on-chip drivers act as receiver-end (i.e. parallel) terminators. This differs from previous parallel-terminated systems which generally use off-chip resistors for termination. In a driving mode, the DTL driver acts as a resistance controlled inverting output buffer. In a receiving mode, the DTL driver may (depending on its position within the system) remain active as a static terminating resistor, or it may be tri-stated. DTL driver control signals are not equivalent to the data and oe signals of a conventional CMOS TSD. Thus circuits using boundary-scan implementations according to the IEEE 1149.1 standard cannot be used with circuits having DTL drivers. Because the IEEE 1149.1 standard is widely used in the industry, there is a need for a system that allows DTL drivers to be used with boundary-scan implementations according to the IEEE 1149.1 specification.

SUMMARY OF THE INVENTION

The present invention provides a system for coupling a DTL driver to a boundary-scan implementation. In one embodiment adapted for the IEEE 1149.1 boundary-scan standard, the system converts data and output enable signals of the IEEE 1149.1 specification to q_up, q_dn, and q25_dn DTL control signals. In a further refinement, the system also converts functional q_up, q_dn and q25_dn signals provided by the circuit under test to the data and output enable signals of the IEEE 1149.1 specification. This feature is advantageously used to capture data into the BSRs of the IEEE 1149.1 boundary-scan implementation. As a result, the system allows the widely used IEEE 1149.1 boundary-scan standard to be used with DTL drivers.

In a particular implementation of the above embodiment, the system includes a first logic circuit for converting the functional q_up, q_dn and q25_dn signals (i.e., generated by the circuit under test) into "response" output enable and data signals to be captured in the Boundary-Scan Registers (BSRs). The system also includes a second logic circuit for converting the output enable and data signals from the BSRs into q_up, q_dn and q25_dn signals. The first and second logic circuits of the system thereby allow the IEEE 1149.1 boundary-scan standard to be used with DTL drivers in a manner that is transparent to boundary-scan testers.

The second logic circuit can further include logic control signals to enhance system performance. A first logic control signal input to the second logic circuit determines which of two pull-down resistance values is used by the DTL driver when it is at a low logic level. A second logic control signal input to the second logic circuit determines whether the DTL driver in a receiving mode acts as a terminator or is in a high impedance state. A third logic control signal input to the second logic circuit places the DTL driver into a high impedance mode independent of the boundary-scan signals provided by the BSRs.

BRIEF DESCRIPTION OF THE DRAWINGS

For a better understanding of the nature and objects of the invention, reference should be made to the following detailed description taken in conjunction with the accompanying drawings, in which.

Like reference numerals refer to corresponding parts throughout the several views of the drawings.

DESCRIPTION OF THE PREFERRED EMBODIMENT

Figure 1:
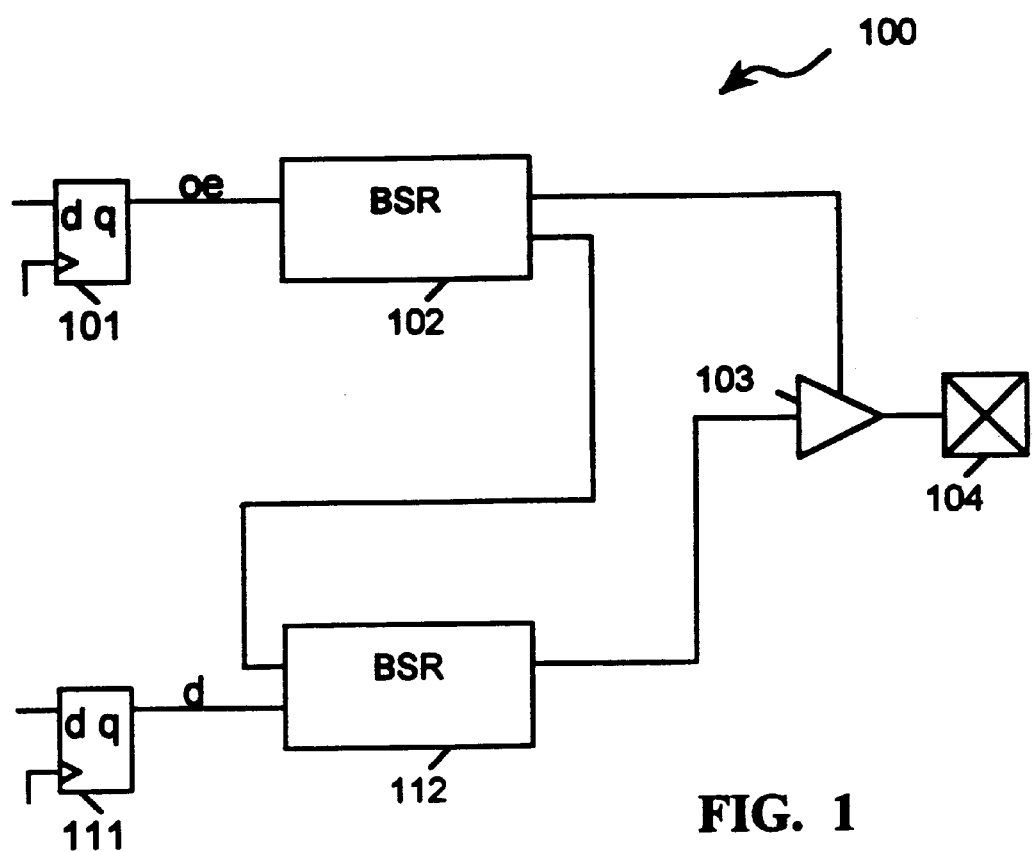
FIG. 1 illustrates a circuit diagram of a portion of a circuit with a conventional boundary-scan implementation.
Figure 2:
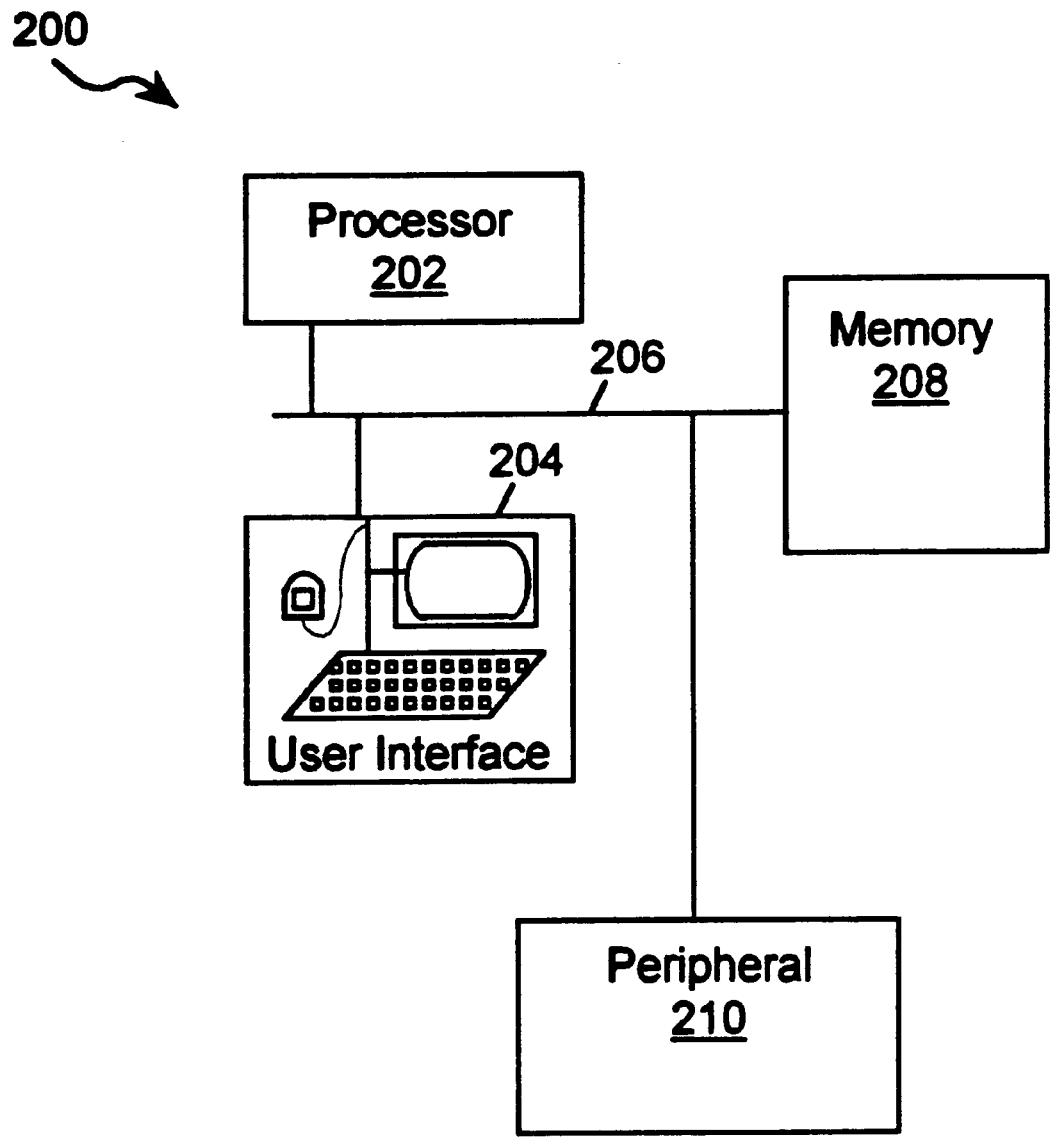
FIG. 2 illustrates a block diagram of an electronic system in which the boundary-scan interface system can be implemented in accordance with one embodiment of the present invention.

The present invention can be generally implemented in digital logic circuits. Referring to FIG. 2, an electronic system 200 in which the boundary-scan interface system can be implemented includes a processor 202, a user interface 204, one or more system buses 206 for transferring data and control signals between system components, one or more peripherals 210 and memory 208, including random access memory as well as non-volatile storage such as disk storage. Electronic system 200 may also include two or more processors. The boundary-scan interface system can be embedded in any of the devices 202, 204, 208 and 210, and typically all such devices include boundary-scan cells.

Figure 3:
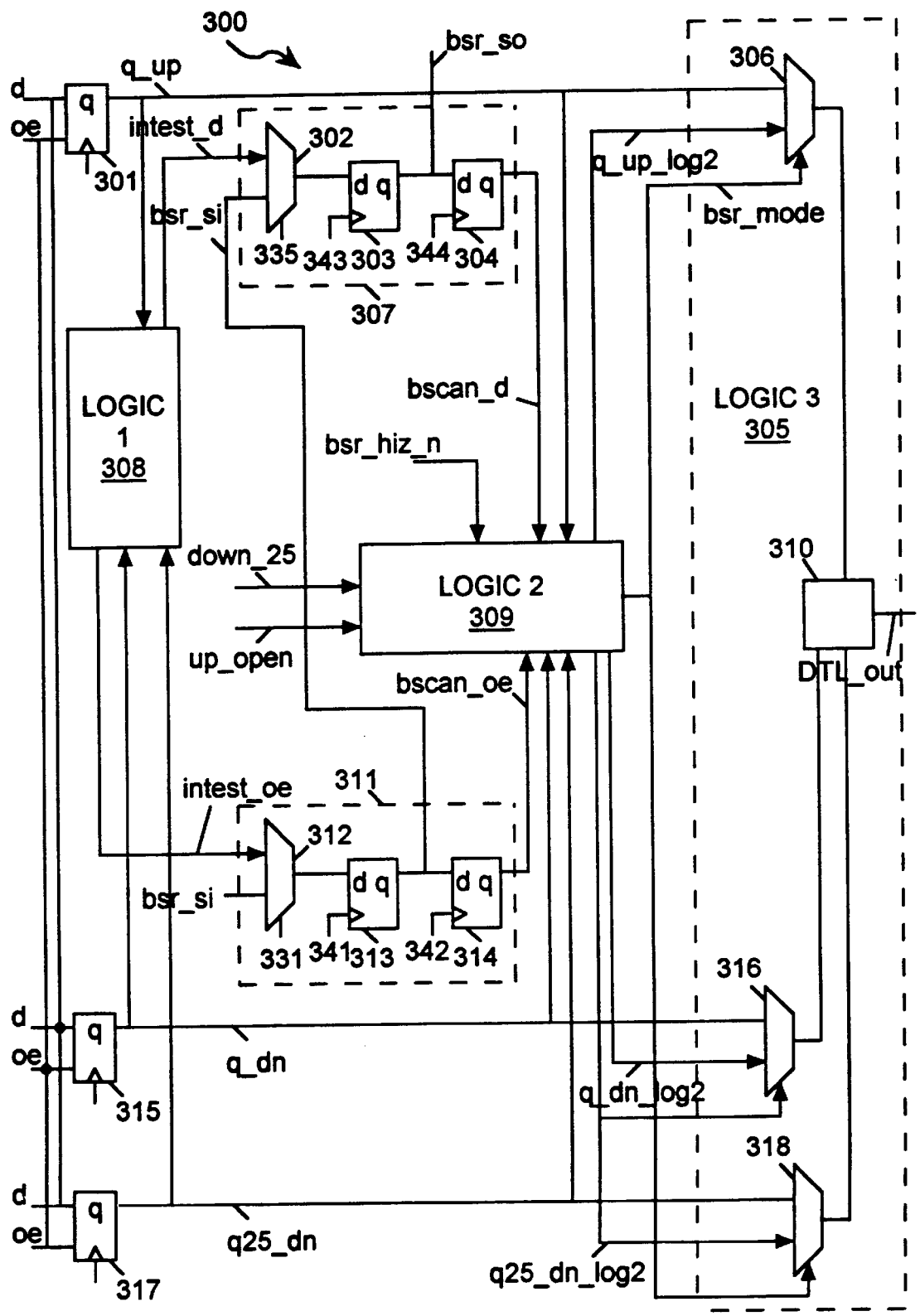
FIG. 3 illustrates a block diagram of a portion of a logic circuit that includes a DTL boundary-scan interface circuit 300 according to one embodiment of the present invention.

FIG. 3 illustrates a block diagram of a portion of a logic circuit that includes DTL boundary-scan interface circuit 300. The circuit includes three pad flops 301, 315 and 317, two boundary-scan registers (BSRs) 307 and 311, and three logic circuits 305, 308 and 309. In DTL I/O circuits, as illustrated in FIG. 3, the same data (d) and output enable (oe) signals are coupled to each of the pad flops 301, 315 and 317. Pad flops 301, 315 and 317 decode the d and oe signals to generate the q_up, q_dn, and q25_dn DTL control signals respectively. These DTL control signals are coupled to logic 1 circuit 308 and to logic 3 circuit 305. The logic 1 circuit converts the q_up, q_dn, and q25_dn DTL control signals into data and output enable signals. The data signal, intest_d, is coupled to an input of BSR 307. The output enable signal, intest_oe, is coupled to an input of BSR 311. BSR 307 outputs a data signal, bscan_d, to the logic 2 circuit 309. BSR 311 outputs an output enable signal, bscan_oe, to the logic 2 circuit. The logic 2 circuit converts the data and output enable signals into DTL control signals q_up_log2, q_dn_log2 and q25_dn_log2. The logic 3 circuit 305 selects the control signal inputs from either the three pad flops 301, 315 and 317 or from the logic 2 circuit. These control signals are coupled to DTL output driver 310 which generates an output signal, DTL_out, based on the control signals.

The logical operation of the DTL boundary-scan interface circuit is summarized in Table 1:

TABLE 1

| Mode | up_open | down_25 | oe | d | q_up | q_dn | q25_dn | DTL_out |
|---|---|---|---|---|---|---|---|---|
| Normal-Receiving | 0 | X | 0 | X | 1 | 1 | 1 | Acts as terminator |
|  | 1 | X | 0 | X | 0 | 1 | 1 | Hi-Z |
| Normal-Driving | X | X | 1 | 1 | 1 | 1 | 1 | 1 |
|  | X | 0 | 1 | 0 | 0 | 0 | 1 | 0 |
|  |  | 1 |  |  |  |  | 0 |  |

In a normal receiving mode the up_open control signal input to the logic 2 circuit controls whether the DTL driver 310 output acts as a terminator or is in a high impedance state (Hi-Z). The X's in the truth table indicate a "don't care" condition. In a normal receiving mode the output enable (oe) signal is at a zero logic level, and the data (d) and down_25 signals are in a don't care condition. The up_open signal is an output receiving resistance control signal. In normal receiving mode, up_open being at a zero logic level, causes q_up, q_dn and q25_dn to be at a logic one level, and DTL_out acts as a terminator, that is it pulls up through 50 ohms. In normal receiving mode, up_open being at a logic one level, causes q_up to be at a zero logic level, and q_dn and q25_dn to be at a logic one level, and DTL_out is then placed in a high impedance state. Using the up-open signal, the logic 2 circuit provides visibility for the termination output receiving mode and the high impedance output receiving mode of the DTL output driver. This allows these output driver functions to be tested using the boundary-scan interface of the present invention.

To place the circuit into a normal driving mode the oe signal is set to a logic one level. In the normal driving mode upopen is in a don't care condition. The down_25 signal is an output driving resistance control signal. In the normal driving mode logic zero level output state, down_25 being at a logic zero level causes the pull-down resistance of DTL_out to be 50 ohms. Setting down_25 to be at a logic one level causes the pull-down down resistance of DTL_out to be 25 ohms. Using the down_25 signal, the logic 2 circuit provides visibility for the two different pull-down resistance values of the DTL output driver. This allows these output driver functions to be tested using the boundary-scan interface of the present invention. Table 1 omits the illegal condition of the q_up signal being at a logic one level at the same that the q_dn signal is at a logic zero level. Table 1 also omits the illegal condition of q_up being at a logic one level at the same time that q25_dn is at a logic zero level.

In a functional mode, the bsr_mode control signals for multiplexers 306, 316 and 318 selects the input for each of these multiplexers coupled to the pad flops 301, 315 and 317. The DTL control signals for the DTL output driver 310 are thereby provided by the d and oe input signals from the device under test via pad flops 301, 315 and 317. In the functional mode the BSRs and logic 1 and 2 circuits are bypassed.

BSRs 307 and 311 are part of a chain of BSRs. In a boundary-scan shift mode, the multiplexer control signal at terminal 331 selects the bsr_si input to multiplexer 312, and the control signal at terminal 335 of multiplexer 302 selects the bsr_si input to multiplexer 302 which is coupled to the shift out output of BSR 311. In this mode test patterns can be loaded into BSR 311 at the bsr_si input to multiplexer 312 which is a test port. This data is then shifted out to BSR 307 into the bsr_si input of multiplexer 302. BSR 307 shifts the data to the next BSR through the bsr_so signal line, and this process can be repeated to provide data to a chain of BSRs.

Figure 7:
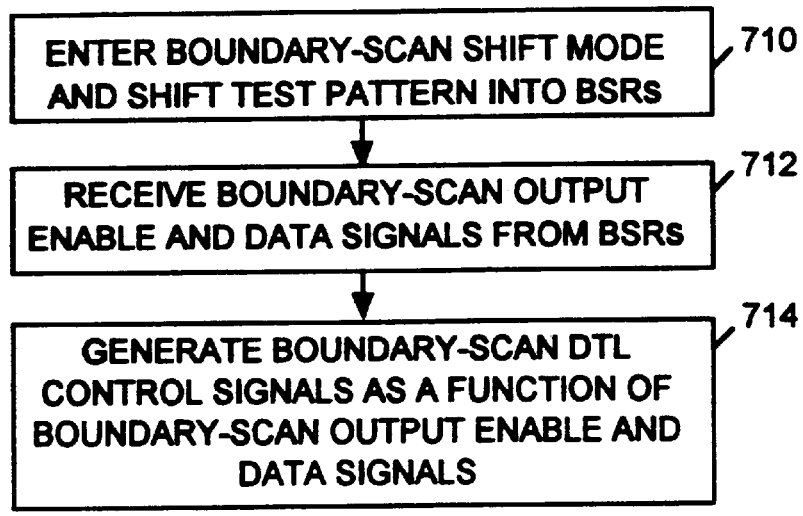
FIG. 7 is a flow chart illustrative of the operation of boundary-scan interface circuit 300.

FIG. 7 illustrates a flow chart of the operation of a BSR to DTL conversion mode of the boundary-scan interface circuit 300. In the FIG. 7 method, first, at step 710, boundary-scan circuit 300 is placed into boundary-scan shift mode and a test pattern is shifted into the BSRs. At step 712, BSR 307 outputs a data signal, bscan_d, to the logic 2 circuit, and BSR 311 outputs an output enable signal, bscan_oe, to the logic 2 circuit. At step 714, the logic 2 circuit generates boundary-scan DTL control signals q_up_log2, q_dn_log2 and q25_dn_log2. The DTL control signals are coupled to multiplexers 306, 316 and 318 in the logic 3 circuit. The input at each of these multiplexers coupled to the logic 2 circuit is selected using the bsr_mode signal. Multiplexers 306, 316 and 318 provide the control signals to DTL output driver 310. DTL output driver 310 resolves the signals as summarized in Table 1 above. Using the method of FIG. 7 the boundary-scan interface circuit 300 can be used to be compliant with the IEEE 1149.1 standard to support the EXTEST test.

Figure 8:
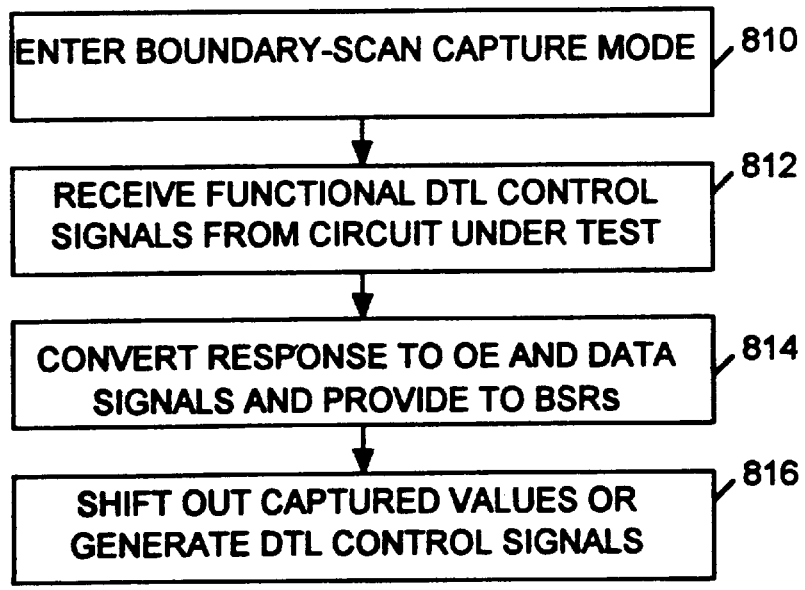
FIG. 8 is a flow chart illustrative of the operation of boundary-scan interface circuit 300.

FIG. 8 illustrates a flow chart of the operation of a DTL to BSR conversion mode of the boundary-scan interface circuit 300. First, at step 810, boundary-scan circuit 300 is placed into a boundary-scan capture mode. In the boundary-scan capture mode the intest_d and intest_oe inputs to BSRs 307 and 311 respectively are selected. Data and output enable signals are received at pad flops 301, 315 and 317. Pad flops 301, 315 and 317 generate DTL control signals q_up, q_dn and q25_dn. At step 812 these DTL control signals are coupled to the logic 1 circuit. The logic 1 circuit converts the DTL control signals into data and output enable signals at step 814. The data signal, intest_d, is coupled to BSR 307. The output enable signal, intest_oe, is coupled to BSR 311. At step 816 the BSRs either shift out the data values, or provide the signals to the logic 2 circuit. BSR 307 provides the data signal, bscan_d, and BSR 311 provides the output enable signal, bscan_oe, to the logic 2 circuit. The logic 2 circuit converts the data and output enable signals into DTL control signals q_up_log2, q_dn_log2 and q25_dn_log2. The bsr_mode control signal selects the logic 2 circuit set of inputs to multiplexers 306, 316 and 318, and the logic 2 circuit DTL control signals are thereby coupled to DTL output driver 310. Using the method of FIG. 8 the boundary-scan interface circuit 300 can be used to implement a IEEE 1149.1 compliant INTEST test.

The boundary-scan interface circuit 300 also supports the optional high impedance signal feature of the IEEE 1149.1 standard. The bsr_hiz_n control signal input to the logic 2 circuit being active generates the 0, 1, 1 values for q_up_log2, q_dn_log2 and q25_dn_log2 respectively, which DTL output driver 310 resolves to a high impedance output state. The bsr_hiz_n signal enables DTL output driver 310 to be placed into a high impedance state independent of the test pattern data or the d and oe pad flop input signal values. In one embodiment the bsr_hiz_n control signal also places the DTL driver output 310 into a high impedance state independent of the logic level of up_open. In another embodiment, when bsr_hiz_n is active, up_open controls whether the DTL output driver 310 acts as a terminator or is in a high impedance state. The bsr_hiz_n signal thus provides for more efficient testing of output drivers by enabling switching the output into a high impedance mode without requiring data to be shifted in through the BSR registers.

Figure 4:
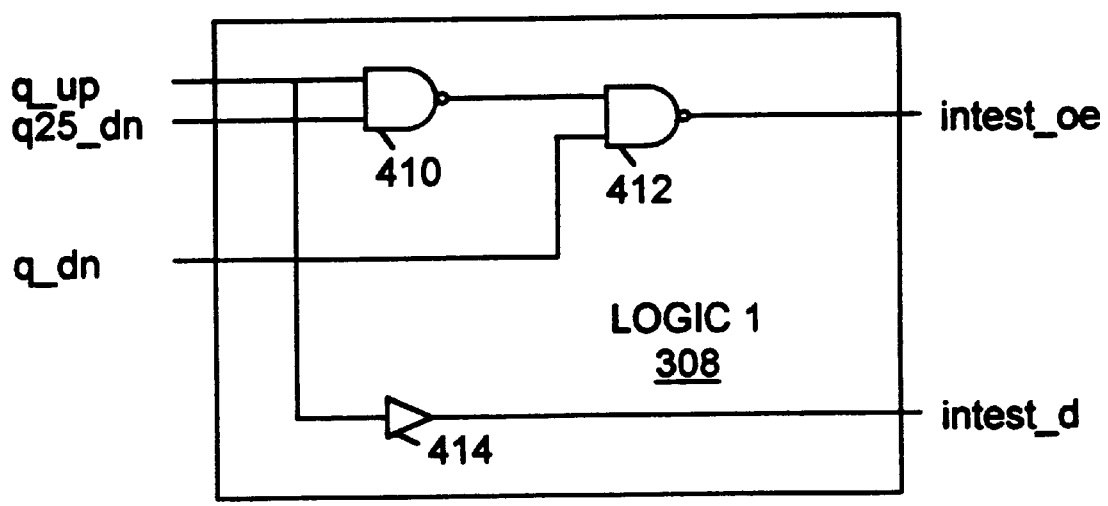
FIG. 4 illustrates a circuit diagram of the logic 1 circuit 308 according to one embodiment of the present invention.

FIG. 4 illustrates a circuit diagram of the logic 1 circuit 308. The logic 1 circuit includes two NAND gates 410 and 412, and a buffer 414. The signals q_up and q25_dn are coupled to the inputs of NAND gate 410. The output of NAND gate 410 is coupled to a first input of NAND gate 412. The second NAND gate 412 input is coupled to q_dn. The output of NAND gate 412 generates the intest_oe signal which is coupled to an input of BSR 311, as shown in FIG. 3 The q_up signal is also coupled to buffer 414. The output of buffer 414 generates the intest_d signal which is coupled to an input of BSR 307, as shown in FIG. 3.

Figure 5A:
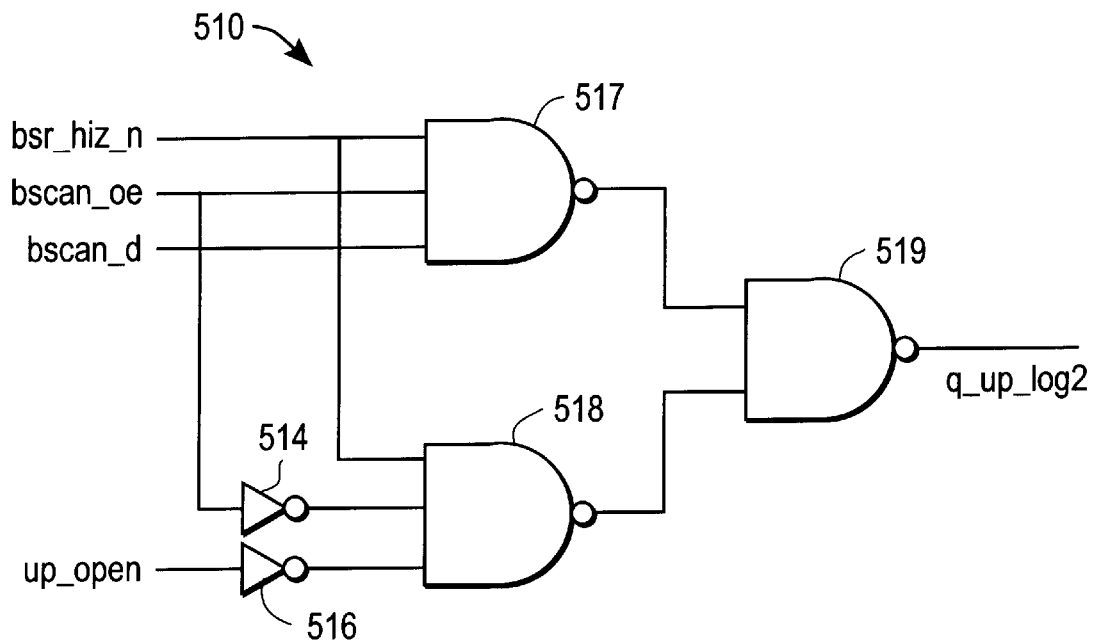
FIGS. 5A–5C illustrate circuit diagrams of the logic 2 circuit 309 according to one embodiment of the present invention.
Figure 5B:
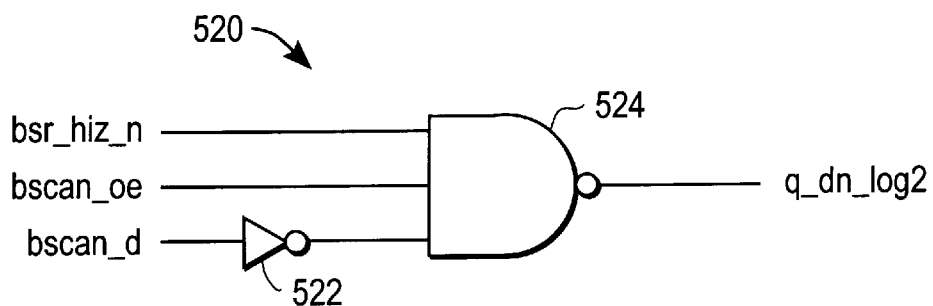
Figure 5C:
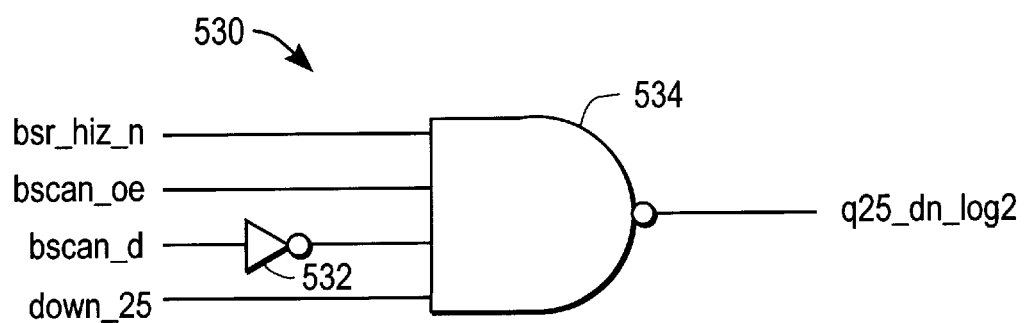

FIGS. 5A, 5B and 5C collectively illustrate a circuit diagram of the logic 2 circuit 309. Referring to FIG. 5A, circuit 510 includes three NAND gates 517–519, and two inverters 514 and 516. The bsr_hiz_n signal is coupled to an input of NAND gate 517 and to an input of NAND gate 518. The bscan_oe signal is coupled to an input of NAND gate 517 and to the input of inverter 514. The inverter 514 output is coupled to an input of NAND gate 518. The up_open signal is coupled to the input of inverter 516. The inverter 516 output is coupled to an input of NAND gate 518. The outputs of NAND gates 517 and 518 provide the inputs to NAND gate 519. The NAND gate 519 output generates the q_up_log2 signal which is an input to the logic 3 circuit.

Referring to FIG. 5B, circuit 520 is comprised of a three input NAND gate 524 and an inverter 522. The bsr_hiz_n and bscan_oe signals are two inputs to NAND gate 524. The bscan_d signal is coupled to the input of inverter 522. The inverter 522 output is coupled to the third input of NAND gate 524. The NAND gate 524 output generates the q_dn_log2 signal which is an input to the logic 3 circuit.

Referring to FIG. 5C, circuit 530 is comprised of a four input NAND gate 534 and an inverter 532. The three inputs to NAND gate 534 are coupled to the bsr_hiz_n, bscan_oe and down_25 signals. The bscan_d signal is coupled to the input of inverter 532. The inverter 532 output is coupled to the remaining NAND gate 534 input. The NAND gate 534 output generates the q25_dn_log2 signal which is an input to the logic 3 circuit.

Figure 6A:
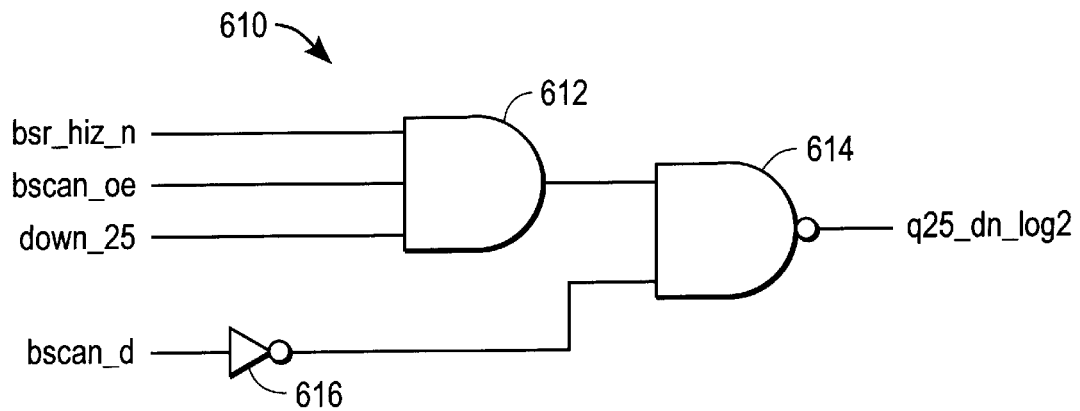
FIGS. 6A and 6B illustrate alternative embodiments of circuit 530 illustrated in FIG. 5C.
Figure 6B:
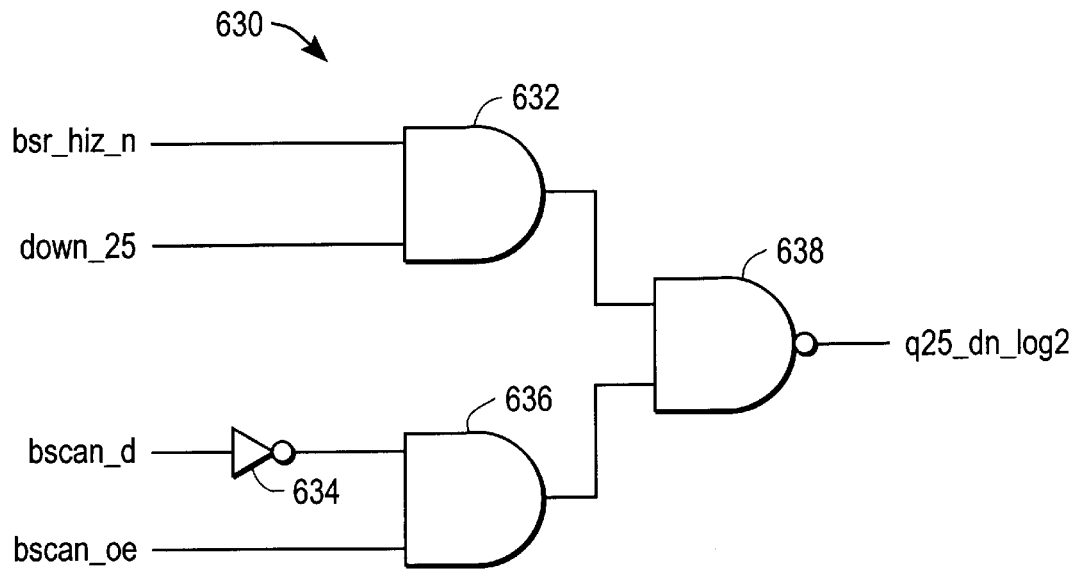

FIGS. 6A and 6B illustrate two logically equivalent alternative embodiments of circuit 530 illustrated in FIG. 5C. Referring to FIG. 6A, circuit 610 is comprised of a three input AND gate 612, a two input NAND gate 614 and an inverter 616. The three inputs to AND gate 612 are coupled to the bsr_hiz_n, bscan_oe, and down_25 signals. The AND gate 612 output is coupled to a NAND gate 614 input. The input of inverter 616 is coupled to the bscan_d signal. The inverter 616 output is coupled to the second input of NAND gate 614. The NAND gate 614 output generates the q25_dn_log2 signal which is an input to the logic 3 circuit.

Referring to FIG. 6B, circuit 630 is comprised of two two input AND gates 632 and 636, a two input NAND gate 638, and an inverter 634. The two inputs of AND gate 632 are coupled to the bsr_hiz_n and down_25 signals. The AND gate 632 output is coupled to one input of NAND gate 638. The input of inverter 634 is coupled to the bscan_d signal. The inverter 634 output is coupled to an input of AND gate 636. The second input of AND gate 636 is coupled to bscan_oe. The AND gate 636 output is coupled to the second input of NAND gate 638. The NAND gate 638 output generates the q25_dn_log2 signal which is an input to the logic 3 circuit. Of course, in light of the present disclosure, those skilled in the art of digital circuits can design many other circuits that implement the functionality defined in FIGS. 4 and 5A–5C without undue experimentation.

The foregoing description, for purposes of explanation, used specific nomenclature to provide a thorough understanding of the invention. However, it will be apparent to one skilled in the art that the specific details are not required in order to practice the invention. In other instances, well known circuits and devices are shown in block diagram form in order to avoid unnecessary distraction from the underlying invention. Thus, the foregoing descriptions of specific embodiments of the present invention are presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. For example, in light of the present disclosure, those skilled in the art of boundary-scan circuits can implement other embodiments adapted for use with other boundary-scan standards without undue experimentation. In addition switching devices other than the multiplexers described may be used in other embodiments. It is intended that the scope of the invention be defined by the following claims and their equivalents

What is claimed is:

1. An apparatus for adapting boundary-scan test circuitry to support multiple signal modes, comprising:
    a first logic circuit to translate driver control signals into boundary-scan signals, said driver control signals being adapted for Dinamyc Termination Logic with on-chip drivers operating as parallel terminators;
    a first boundary-scan register (BSR) coupled to said first logic circuit, to store boundary-scan signals;
    a second BSR coupled to said first logic circuit, to store said boundary-scan signals;
    a second logic circuit coupled to said first BSR and to said second BSR, to translate boundary-scan signals into driver control signals; and
    a third logic circuit having a driver, said third logic circuit coupled to said second logic circuit, said third logic circuit configured so that said driver provides, in response to driver control signals received from said second logic circuit, a function equivalent to a response of a boundary-scan driver to boundary-scan signals from first and second BSRs.

2. The apparatus of claim 1 wherein said second logic circuit includes an output driving resistance control signal terminal, wherein in a first operational mode of said third logic circuit with said driver at a low output logic level, a first logic level signal at said output driving resistance control signal terminal causes said driver to have a first pull-down resistance value, and a second logic level signal at said output driving resistance control signal terminal causes said driver to have a second pull-down resistance value.

3. The apparatus of claim 1 wherein said second logic circuit includes an output receiving resistance control signal terminal, wherein, with said third logic circuit in a second operational mode, a first logic level signal at said output receiving resistance control signal terminal causes said driver to have a first pull-up resistance value, and a second logic level signal at said output receiving resistance control signal terminal causes said driver to be in a high impedance state.

4. The apparatus of claim 1 wherein said second logic circuit includes a high impedance control signal terminal, wherein a first logic level signal at said high impedance control signal terminal causes said driver to be in a high impedance state independent of logic levels of signals coupled to said first and second BSRs.

5. The apparatus of claim 4 wherein said apparatus is configured for use with boundary-scan test circuitry according to IEEE standard Test Access Port and Boundary-Scan Architecture IEEE Std 1149.1-1990.

6. The apparatus of claim 1 wherein said first logic circuit comprises:
    a first NAND gate having two input terminals and an output terminal;
    a second NAND gate having two input terminals and an output terminal, said first NAND gate output terminal coupled to one of said second NAND gate input terminals, said second NAND gate output terminal coupled to said second BSR; and
    a buffer coupled in series between one of said first NAND gate input terminals and said first BSR.

7. The apparatus of claim 5 wherein said second logic circuit comprises:
    a first, a second, a third, a fourth and a fifth input terminal;
    a first NAND gate having three input terminals and an output terminal, said second logic circuit first, second and third input terminals each coupled to one of said first NAND gate input terminals;
    a second NAND gate having three input terminals and an output terminal, said second logic circuit first input terminal coupled to one of said second NAND gate input terminals;
    a first inverter coupled in series between said second logic circuit second input terminal and one of said second NAND gate input terminals;
    a second inverter coupled in series between said second logic circuit fourth input terminal and one of said second NAND gate input terminals;
    a third NAND gate having two input terminals and an output terminal, said first NAND gate output terminal coupled to one of said third NAND gate input terminals, said second NAND gate output terminal coupled to one of said third NAND gate input terminals, said third NAND gate output terminal coupled to said third logic circuit;
    a fourth NAND gate having three input terminals and an output terminal, said second logic circuit first and second input terminals each coupled to one of said fourth NAND gate input terminals, said fourth NAND gate output terminal coupled to said third logic circuit;
    a third inverter coupled in series between said second logic circuit third input terminal and one of said fourth NAND gate input terminals;
    a fifth NAND gate having four input terminals and an output terminal, said second logic circuit first, second and fifth input terminals each coupled to one of said fifth NAND gate input terminals, said fifth NAND gate output terminal coupled to said third logic circuit; and a fourth inverter coupled in series between said second logic circuit third input terminal and one of said fifth NAND gate input terminals.

8. The apparatus of claim 5 wherein said second logic circuit comprises:

a first, a second, a third, a fourth and a fifth input terminal;

a first NAND gate having three input terminals and an output terminal, said second logic circuit first, second and third input terminals each coupled to one of said first NAND gate input terminals;

a second NAND gate having three input terminals and an output terminal, said second logic circuit first input terminal coupled to one of said second NAND gate input terminals;

a first inverter coupled in series between said second logic circuit second input terminal and one of said second NAND gate input terminals;

a second inverter coupled in series between said second logic circuit fourth input terminal and one of said second NAND gate input terminals;

a third NAND gate having two input terminals and an output terminal, said first NAND gate output terminal coupled to one of said third NAND gate input terminals, said second NAND gate output terminal coupled to one of said third NAND gate input terminals, said third NAND gate output terminal coupled to said third logic circuit;

a fourth NAND gate having three input terminals and an output terminal, said second logic circuit first and second input terminals each coupled to one of said fourth NAND gate input terminals, said fourth NAND gate output terminal coupled to said third logic circuit;

a third inverter coupled in series between said second logic circuit third input terminal and one of said fourth NAND gate input terminals;

an AND gate having three input terminals and an output terminal, said second logic circuit first, second and fifth input terminals each coupled to one of said AND gate input terminals;

a fifth NAND gate having two input terminals and an output terminal, said AND gate output terminal coupled to one of said fifth NAND gate input terminals; and a fourth inverter coupled in series between said second logic circuit third input terminal and one of said fifth NAND gate input terminals, said fifth NAND gate output terminal coupled to said third logic circuit.

9. The apparatus of claim 5 wherein said second logic circuit comprises:

a first, a second, a third, a fourth and a fifth input terminal;

a first NAND gate having three input terminals and an output terminal, said second logic circuit first, second and third input terminals each coupled to one of said first NAND gate input terminals;

a second NAND gate having three input terminals and an output terminal, said second logic circuit first input terminal coupled to one of said second NAND gate input terminals;

a first inverter coupled in series between said second logic circuit second input terminal and one of said second NAND gate input terminals;

a second inverter coupled in series between said second logic circuit fourth input terminal and one of said second NAND gate input terminals;

a third NAND gate having two input terminals and an output terminal, said first NAND gate output terminal coupled to one of said third NAND gate input terminals, said second NAND gate output terminal coupled to one of said third NAND gate input terminals, said third NAND gate output terminal coupled to said third logic circuit;

a fourth NAND gate having three input terminals and an output terminal, said second logic circuit first and second input terminals each coupled to one of said fourth NAND gate input terminals, said fourth NAND gate output terminal coupled to said third logic circuit;

a third inverter coupled in series between said second logic circuit third input terminal and one of said fourth NAND gate input terminals;

a first AND gate having two input terminals and an output terminal, said second logic circuit first and fifth input terminals each coupled to one of said first AND gate input terminals;

a second AND gate having two input terminals and an output terminal, said second logic circuit second input terminal coupled to one of said second AND gate second terminals;

a fourth inverter coupled in series between said second logic circuit third input terminal and one of said second AND gate input terminals; and a fifth NAND gate having two input terminals and an output terminal, said first AND gate output terminal coupled to one of said fifth NAND gate input terminals, said second AND gate output terminal coupled to one of said fifth NAND gate input terminals, said fifth NAND gate output terminal coupled to said third logic circuit.

10. A method for adapting boundary-scan test circuitry to support multiple signal modes, comprising the steps of:

entering a boundary-scan load mode, wherein a test pattern is loaded into a first boundary-scan register (BSR) and a second BSR, said first BSR storing a first test pattern value, and said second BSR storing a second test pattern value;

receiving a first boundary-scan signal from said first BSR corresponding to said first test pattern value, a second boundary-scan signal from said second BSR corresponding to said second test pattern value, and at least one logic control signal; and generating a first, a second and a third driver control signal as a function of said first and second boundary-scan signals and said at least one logic control signal, wherein in a boundary-scan test mode said first, second and third driver control signals cause a driver to provide a function equivalent to a response of a boundary-scan driver to said first and second boundary-scan signals, said first, second, and third driver control signals being adapted for Dynamic Termination Logic with on-chip drivers operating as parallel terminators.

11. The method of claim 10 wherein said receiving step further comprises receiving a first logic control signal, wherein in a first operational mode with said driver at a low output logic level, said first logic control signal being at a first logic level causes said driver to have a first pull-down resistance value, and said first logic control signal being at a second logic level causes said driver to have a second pull-down resistance value.

12. The method of claim 10 wherein said receiving step further comprises receiving a second logic control signal, wherein in a second operational mode said second logic control signal being at a first logic level causes said driver to have a first pull-up resistance value, and said second logic signal being at a second logic level causes said driver to be in a high impedance state.

13. The method of claim 10 wherein said receiving step further comprises receiving a third logic control signal, wherein said third logic control signal being at a first logic level causes said driver to be in a high impedance state independent of logic levels of said first and second boundary-scan signals.

14. A method for adapting boundary-scan test circuitry to support multiple signal modes, comprising the steps of:

acquiring a plurality of driver control signals at a first logic circuit;

converting said driver control signals into a first boundary-scan signal and a second boundary-scan signal;

receiving said first boundary-scan signal, said second boundary-scan signal, and at least one logic control signal at a second logic circuit; and generating a first, a second and a third driver control signal as a function of said first and second boundary-scan signals and said at least one logic control signal, wherein in a boundary-scan test mode said first, second and third driver control signals cause a driver to provide a function equivalent to a response of a boundary-scan driver to said first and second boundary-scan signals, said first, second, and third driver control signals being adapted for Dynamic Termination Logic with on-chip drivers operating as parallel terminators.

15. The method of claim 14 wherein said receiving step further comprises receiving a first logic control signal, wherein in a first operational mode with said driver at a low output logic level, said first logic control signal being at a first logic level causes said driver to have a first pull-down resistance value, and said first logic control signal being at a second logic level causes said driver to have a second pull-down resistance value.

16. The method of claim 14 wherein said receiving step further comprises receiving a second logic control signal, wherein in a second operational mode said second logic control signal being at a first logic level causes said driver to have a first pull-up resistance value, and said second logic signal being at a second logic level causes said driver to be in a high impedance state.

17. The method of claim 14 wherein said receiving step further comprises receiving a third logic control signal, wherein said third logic control signal being at a first logic level causes said driver to be in a high impedance state independent of logic levels of said first and second boundary-scan signals.

18. A computer system comprising:

a bus;

a memory coupled to said bus; and a processor coupled to said bus, wherein said processor includes a circuit for use with a driver comprising:

a first logic circuit, wherein said first logic circuit translates driver control signals into boundary-scan signals, said driver control signals being adapted for Dynamic Termination Logic with on-chip drivers operating as parallel terminators;

a first boundary-scan register (BSR) coupled to said first logic circuit, to store boundary-scan signals;

a second BSR coupled to said first logic circuit, to store boundary-scan signals;

a second logic circuit, said second logic circuit coupled to said first BSR and to said second BSR, wherein said second logic circuit translates boundary-scan signals into driver control signals; and a third logic circuit having a driver, said third logic circuit coupled to said second logic circuit, wherein said third logic circuit is configured so that said driver provides, in response to driver control signals received from said second logic circuit, a function equivalent to a response of a boundary-scan driver to boundary-scan signals from said first and second BSRs.

19. The computer system of claim 18 wherein said second logic circuit includes an output driving resistance control signal terminal, wherein in a first operational mode of said third logic circuit with said driver at a low output logic level, a first logic level signal at said output driving resistance control signal terminal causes said driver to have a first pull-down resistance value, and a second logic level signal at said output driving resistance control signal terminal causes said driver to have a second pull-down resistance value.

20. The computer system of claim 18 wherein said second logic circuit includes an output receiving resistance control signal terminal, wherein, with said third logic circuit in a second operational mode, a first logic level signal at said output receiving resistance control signal terminal causes said driver to have a first pull-up resistance value, and a second logic level signal at said output receiving resistance control signal terminal causes said driver to be in a high impedance state.

* * * * *

UNITED STATES PATENT AND TRADEMARK OFFICE
CERTIFICATE OF CORRECTION

PATENT NO. : 6,219,812 B1
DATED : April 17, 2001
INVENTOR(S) : Farideh Golshan

It is certified that error appears in the above-identified patent and that said Letters Patent is hereby corrected as shown below:

<u>Column 7,</u>
Line 41, replace "Dinamyc" with -- Dynamic --.

Signed and Sealed this

Sixth Day of November, 2001

Attest:

NICHOLAS P. GODICI
Attesting Officer
*Acting Director of the United States Patent and Trademark Office*